(12) United States Patent
Suzuki et al.

(10) Patent No.: US 6,528,370 B2
(45) Date of Patent: Mar. 4, 2003

(54) SEMICONDUCTOR DEVICE AND METHOD OF MANUFACTURING THE SAME

(75) Inventors: Toshikazu Suzuki, Kanagawa (JP); Hideki Ono, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/207,568

(22) Filed: Jul. 29, 2002

(65) Prior Publication Data

US 2002/0185642 A1 Dec. 12, 2002

Related U.S. Application Data

(62) Division of application No. 09/657,302, filed on Sep. 7, 2000, now Pat. No. 6,469,315.

(30) Foreign Application Priority Data

Sep. 7, 1999 (JP) .......................................... 11-253531

(51) Int. Cl.[7] .............................................. H01L 21/336
(52) U.S. Cl. ...................... 438/257; 438/191; 438/196; 257/8; 257/20
(58) Field of Search .............................. 438/170, 172, 438/191, 196, 590, 257; 257/8, 20

(56) References Cited

U.S. PATENT DOCUMENTS

| | | | | |
|---|---|---|---|---|
| 5,294,566 A | * | 3/1994 | Mori | 438/170 |
| 5,847,409 A | * | 12/1998 | Nakayama | 257/15 |
| 5,925,903 A | * | 7/1999 | Iwanaga et al. | 257/284 |

* cited by examiner

*Primary Examiner*—David Nelms
*Assistant Examiner*—Andy Huynh
(74) *Attorney, Agent, or Firm*—Sonnenschein, Nath & Rosenthal

(57) ABSTRACT

Provided are a semiconductor device which shows excellent negative differential conductance or negative transconductance and is manufactured without a complicated manufacturing process and a method of manufacturing the same. The semiconductor device includes a channel layer serving as a conduction region and a floating region electrically separated from the channel layer. Provided between the channel layer and the floating region is a quantum well layer constituted with a pair of barrier layers and a quantum well layer sandwiched between the pair of barrier layers. A source electrode and a drain electrode are electrically connected to the channel layer. A gate electrode is provided in an opposite position from the well layer in the floating region. When changing a drain voltage relative to a predetermined gate voltage, drain current characteristics show negative differential conductance.

3 Claims, 9 Drawing Sheets

SEMICONDUCTOR DEVICE AND METHOD OF MANUFACTURING THE SAME

RELATED APPLICATION DATA

The present application claims priority to Japanese Application No. P11-253531, filed Sep. 7, 1999, and is a divisional of U.S. application Ser. No. 09/657,302, filed Sep. 7, 2000 now U.S. Pat. No. 6,469,315, both of which are incorporated herein by reference to the extent permitted by law.

BACKGROUND OF THE INVENTION

1. Field of the Invention

The present invention relates to a semiconductor device in which a quantum well layer is employed and a method of manufacturing the same. More specifically, the invention relates to a semiconductor device having a three-terminal device structure in which each of a source electrode, a drain electrode and a gate electrode is provided, and a method of manufacturing the same.

2. Description of the Related Art

A semiconductor device which shows negative differential conductance (NDC) can be broadly applied to different kinds of fields as a functional device. Among such devices, with regard to a two-terminal device, with advances in ultra-thin-film crystal growth technique such as a molecular beam epitaxy method, a metal organic chemical vapor deposition method or the like, a resonant-tunneling diode which shows excellent characteristics making use of resonant-tunneling effect in a quantum well has been easily manufactured.

On the other hand, a three-terminal device which can control the negative differential conductance characteristic in a third electrode has greater flexibility than the two-terminal device.

Examples of three-terminal devices include, for example, a three-terminal device in which a third electrode is formed in a quantum well, which is constituted with ultra thin films, of a vertical resonant-tunneling diode (K. Maezawa and T. Mizutani, Jpn. J. Appl. Phys. 32 L42, 1993), a quasi-three-terminal device in which a resonant-tunneling diode and a three-terminal transistor are formed on the same substrate (K. J. Chen, K. Maezawa and Y. Yamamoto, IEEE Electron Device, Lett. 17 127, 1996) and a three-terminal device in which real-space transfer of hot-electrons is used (C.-T. Liu, S. Luryi. P., A. Garbinski, A. Y. Cho, and D. L. Sivico, IEEE Trans, Electron Device 38 2417, 1991). In addition, a three-terminal device in which a third electrode is provided in an interband diode (T. Uemura and T. Baba, Jpn. J. Appl. Phys. 32 L207, 1994) is developed.

However, these three-terminal devices have the following problems. For the three-terminal device in which the third electrode is formed in the quantum well, which is constituted with the ultra thin films, of the vertical resonant-tunneling diode, there exists a problem such that its manufacturing process is complicated and resistance in the third electrode becomes large. With the quasi-three-terminal device where the resonant-tunneling diode and the three-terminal transistor are formed on the same substrate, the manufacturing process is complicated and difficult. Further, in the three-terminal device in which a third electrode is provided in an interband tunnel diode, a complicated and difficult manufacturing process is required. In the three-terminal device in which real-space transfer of hot-electrons is utilized, there is a problem such that large electric field needs to be applied in order to increase the temperature of electrons. Thus, it is difficult to control the characteristic of the three-terminal device.

SUMMARY OF THE INVENTION

The present invention has been achieved in view of the above problems. It is an object of the invention to provide a semiconductor device which shows excellent negative differential conductance or negative transconductance and is manufactured without a complicated manufacturing process, and a method of manufacturing the same.

The semiconductor device of the invention includes a conduction region, a floating region which is electrically separated from the conduction region, a quantum well layer disposed between the conduction region and the floating region, a source electrode and a drain electrode each of which is electrically connected to the conduction region, and a gate electrode provided in a position opposite from the quantum well layer in the floating region. Furthermore, in the semiconductor device of the invention, drain current characteristics show negative differential conductance when changing the drain voltage relative to a predetermined gate voltage.

Moreover, the method of manufacturing a semiconductor device of the invention includes a first step for sequentially forming the conduction region, the quantum well layer, and the floating region on a substrate, and a second step for shaping the floating region by selectively removing a region, in which the source electrode and the drain electrode will be formed, by an etching agent including citric acid or mixing chlorine-based and fluorine-based species.

With the semiconductor device of the present invention, as varying the drain voltage relative to the gate voltage, transfer of carriers occurs due to resonant-tunneling effect between the conduction region and the floating region through the quantum well layer. Accordingly, negative differential conductance occurs in the drain current characteristics.

With the method of manufacturing a semiconductor device of the present invention, the conduction region, the quantum well layer and the floating region are formed on the substrate in this order, and the region where the source electrode and the drain electrode will be formed is selectively removed by an etching agent including critic acid or mixing chlorine-based and fluorine-based species.

Other and further objects, features and advantages of the invention will appear more fully from the following description.

DETAILED DESCRIPTION OF THE PREFERRED EMBODIMENTS

Embodiments of the present invention will be described in detail below with reference to the accompanying drawings.
[First Embodiment]

Figure 1:
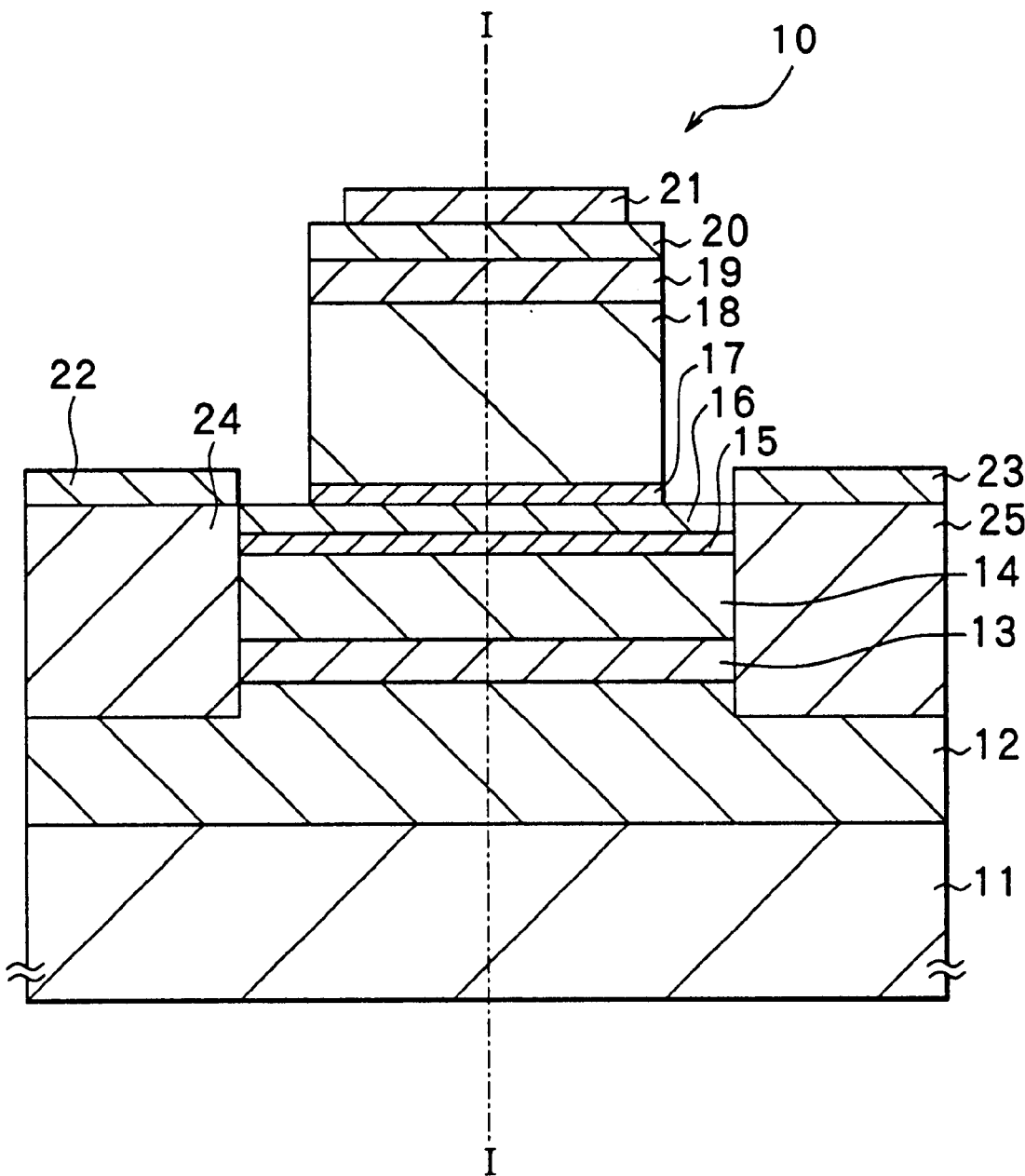
FIG. 1 is a cross section showing the structure of an electric field effect transistor device according to a first embodiment of the present invention.

FIG. 1 shows a cross sectional structure of an electric field effect transistor device 10 according to the first embodiment of the present invention. The electric field effect transistor device 10 has a structure such that sequentially layered on, for example, a semi-insulating GaAs (001) substrate 11 are a buffer layer 12 made of, for example, GaAs for regulating crystallinity, a channel layer 13 made of, for example, n-type doped GaAs in which approximately $3\times10^{17}/cm^3$ of n-type impurities are doped, a spacer layer 14 made of, for example, GaAs, a barrier layer 15 made of, for example, AlAs, a well layer 16 made of, for example, GaAs, a barrier layer 17 made of, for example, AlAs, a floating region 18 made of, for example, GaAs, a gate barrier layer 19 made of, for example, AlAs and a cap layer 20 made of, for example, GaAs. Among the layers and the region, at least a part of the channel layer 13 and the spacer layer 14 functions as a conduction region responsive to the applied voltage.

The buffer layer 12 is, for example, 400 nm in thickness in a vertical direction in FIG. 1 (simply referred to as "thickness" herein after); the channel layer 13 is, for example, 20 nm in thickness; the spacer layer 14 is, for example, 120 nm in thickness; the barrier layer 15 is, for example, 2 nm in thickness; the well layer 16 is, for example, 6 nm in thickness; the barrier layer 17 is, for example, 2 nm in thickness; the floating region 18 is, for example, 200 nm in thickness; the gate barrier layer 19 is, for example, 30 nm in thickness; and the cap layer 20 is, for example, 10 nm in thickness. Each of the thicknesses of the barrier layer 15 and the barrier layer 17 enables electrons to tunnel, but the thickness of the gate barrier layer 19 does not enable electrons to easily tunnel.

In the well layer 16, two dimensional electronic quantum levels are formed. With regard to the thickness of the well layer 16, the quantum levels formed in the well layer 16 is sufficiently greater than kBT (kB denotes the Boltzmann constant=$1.38\times10^{-23}$, while T denotes the absolute temperature of the device.) That is, the barrier layer 15, the well layer 16 and the barrier layer 17 constitute a quantum well layer having the energy levels of two-dimensional electron states.

A gate electrode 21 made of metal such as Al (aluminum), Au (gold), or the like is formed on the cap layer 20. The gate electrode 21 is in a schottky contact state with the cap layer 20. Moreover, the width, in a horizontal direction in FIG. 1, of the barrier layer 17, the floating region 18, the gate barrier layer 19 and the cap layer 20 is narrower than that of lower layers such as the well layer 16. A source electrode 22 and a drain electrode 23 are formed so as to sandwich the floating region 18 on the well layer 16. Each of the source electrode 22 and the drain electrode 23 has, for example, a structure such that AuGe (gold germanium), Ni (nickel) and Au are layered in sequence from the side of the well layer 16 and then heat treatment is applied thereon to be alloyed.

Furthermore, formed between the source electrode 22 and the channel layer 13 is a source region 24 composed of an alloy layer of a semiconductor and metals. The source region 24, and the source electrode 22, the channel layer 13 and the space layer 14 are kept in an ohmic contact state. Formed between the drain electrode 23 and channel layer 13 is a drain region 25 composed of the alloy layer of the semiconductor and metals. The drain region 25, and the drain electrode 23, the channel layer 13 and the spacer layer 14 are kept in the ohmic contact state. Accordingly, the floating region 18 is electrically separated from the source electrode 22, the drain electrode 23 and the conduction region. As will be described later, the floating region 18 functions as a storage layer to store electrons reached from the conduction region due to resonant-tunneling effect.

FIGS. 2 through 5 show energy band structures in a direction along the I—I line of the electric field effect transistor device 10 shown in FIG. 1. With the electric field effect transistor device 10, the bottom of conduction bands are shown in FIGS. 2 through 5. In FIGS. 2 through 5, $E_F$ denotes a fermi level, while $E_0$ denotes a vacuum level.

Figure 2:
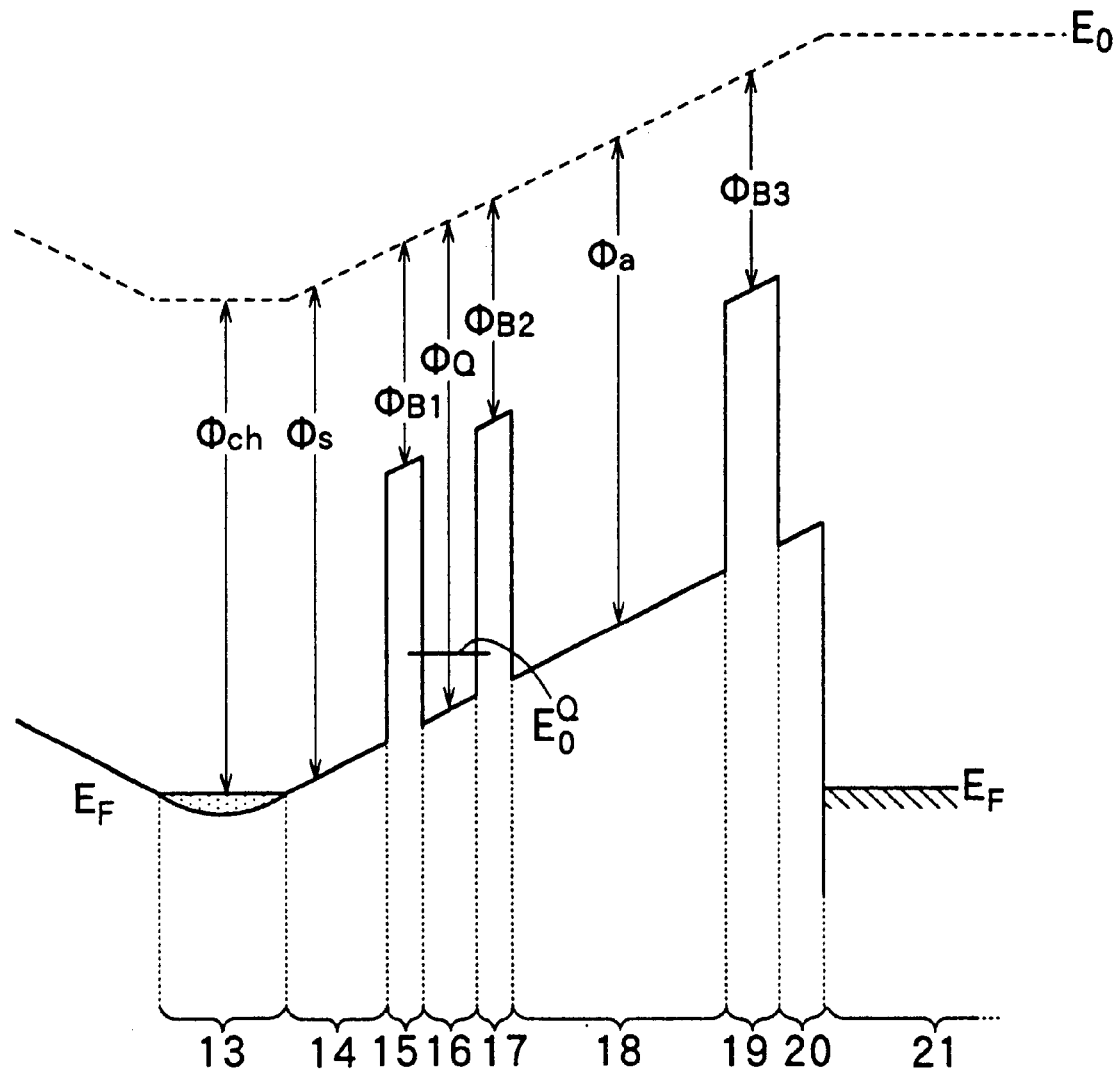
FIG. 2 is a structural diagram of an energy band in the direction along the I—I line of the electric field effect transistor device shown in FIG. 1.

In the electric field effect transistor device 10, as illustrated in FIG. 2, each of an electron affinity $\phi_{ch}$ of the substance comprising the channel layer 13, an electron affinity $\phi_S$ of the substance comprising the spacer layer 14, an electron affinity $\phi_Q$ of the substance comprising the well layer 16, and an electron affinity $\phi a$ of the substance comprising the floating region 18 is greater than each of an electron affinity $\phi_{B1}$ of the substance comprising the barrier layer 15, an electron affinity $\phi_{B2}$ of the substance comprising the barrier layer 17 and an electron affinity $\phi_{B3}$ of the substance comprising the gate barrier layer 19. In the well layer 16, the lowest energy level $E_0^Q$ of two-dimensional electron states exists.

With the electric field effect transistor device 10, the relative difference in energy between the conduction region 13a (that is, at least a part of the channel layer 13 and the spacer layer 14) and a two-dimensional electron state localized in the well layer 16 is changed by varying voltage applied to each of the gate electrode 21, the source electrode 22 and the drain electrode 23.

Figure 3:
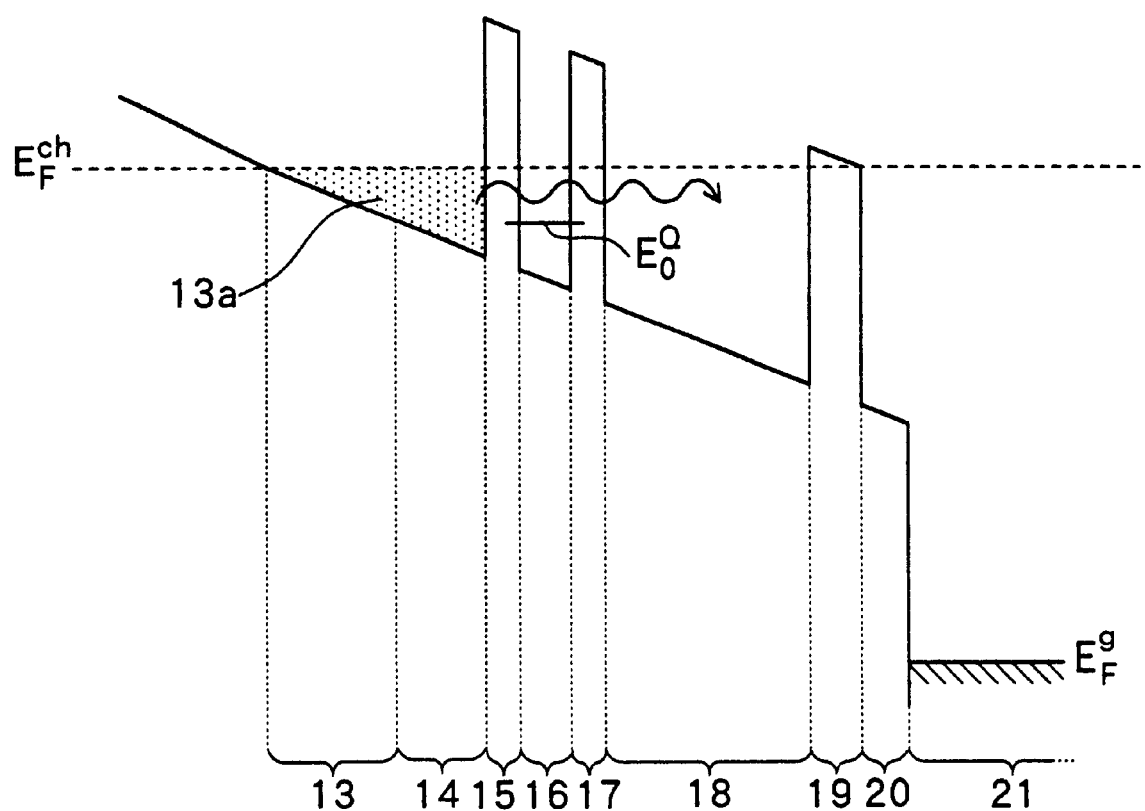
FIG. 3 is a structural diagram of an energy band in the direction along the I—I line of FIG. 1, explaining the resonant-tunneling effect of the electric field effect transistor device shown in FIG. 1.

For instance, as shown in FIG. 3, when the lowest energy level $E_0^Q$ of the two-dimensional electron states localized in the well layer 16 is higher than the bottom of the conduction band and lower than the fermi energy level $E_F^{ch}$ in the conduction region 13a, that is the relative difference in energy between the conduction region 13a and the two-dimensional electron state localized in the well layer 16 is in a certain range, a resonant-tunneling effect occurs through the two-dimensional electron state in the well layer 16. By this resonant-tunneling effect, a wave function of the electrons is spread from the conduction region 13a to the floating region 18. Moreover, in the floating region 18 energy relaxation of electrons takes place mainly due to LO phonon emission, and the relaxed electrons are stored in the floating region 18. Consequently, the resonant-tunneling effect increases the density of electrons in the floating region 18.

Since the floating region 18 is electrically separated from each of the source electrode 22 and the drain electrode 23, electrons in the floating region 18 hardly contribute electric conductivity in the conduction region 13a. Further, an increase in electron density in the floating region 18 causes a decrease in electric conductivity between the source electrode 22 and the drain electrode 23 due to charging effects. In other words, in the state shown in FIG. 3 the electric conductivity in the conduction region 13a disposed between the source electrode 22 and the drain electrode 23 decreases due to the resonant-tunneling effect.

Figure 4:
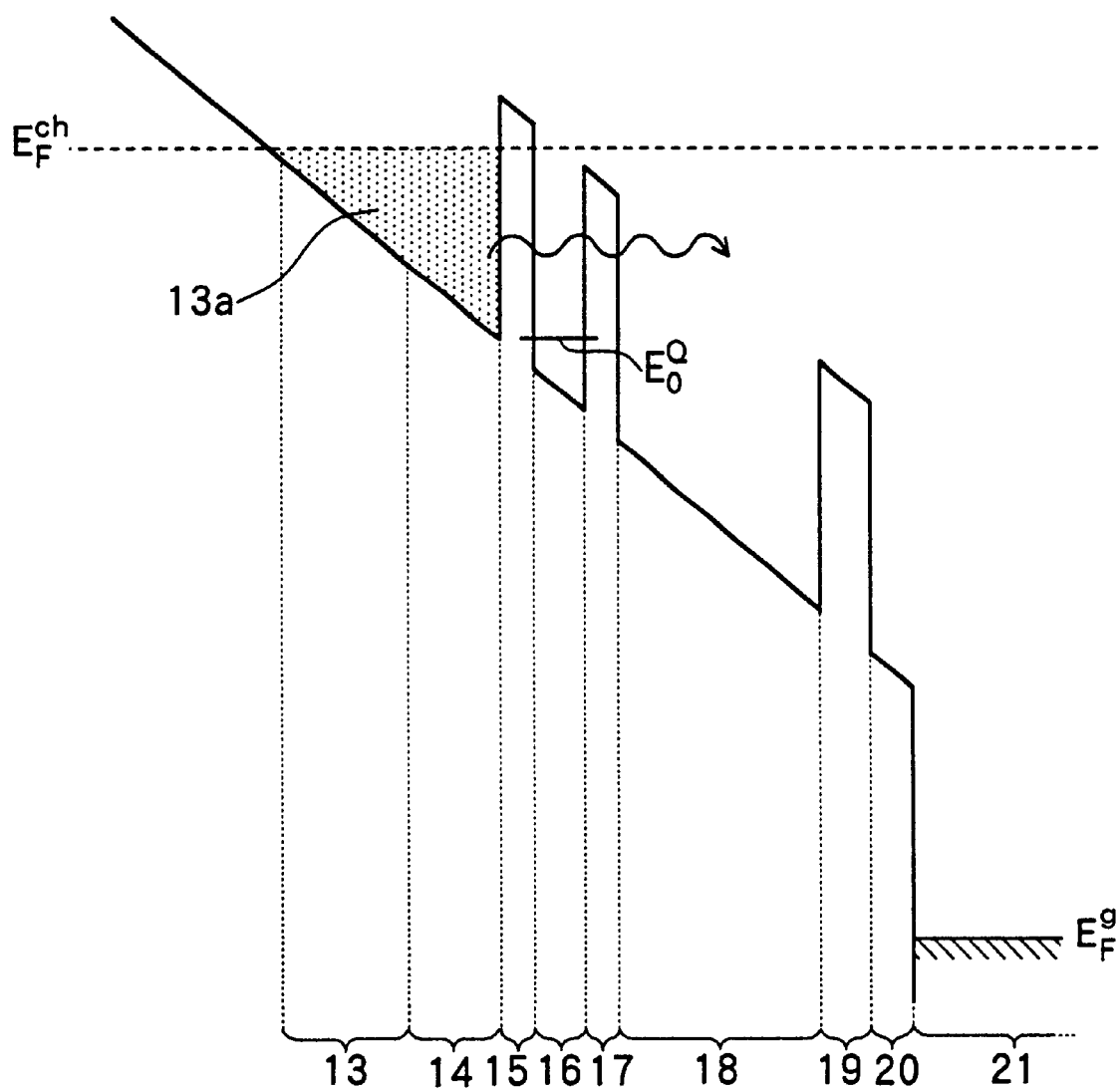
FIG. 4 is a structural diagram of an energy band in the direction along the I—I line of FIG. 1, explaining the resonant-tunneling effect of the electric field effect transistor device shown in FIG. 1.

Owing to the conservation of momentum, the kinetic energy $E_z$ in the direction along the thickness of the electrons which tunnel resonantly is almost equal to the lowest energy $E_0^Q$ of the two-dimensional electron states. Therefore, when the lowest energy level $E_0^Q$ of the two-dimensional electron states localized in the well layer 16 is lower than the bottom of the conduction band in the conduction region 13a, no resonance occurs (non-resonance). When the lowest energy level $E_0^Q$ of the two-dimensional electron states localized in the well layer 16 is identical to the bottom of the conduction band in the conduction region 13a, the number of the channel electrons which tunnel resonantly reaches the maximum (maximum resonance) as shown in FIG. 4.

Figure 5:
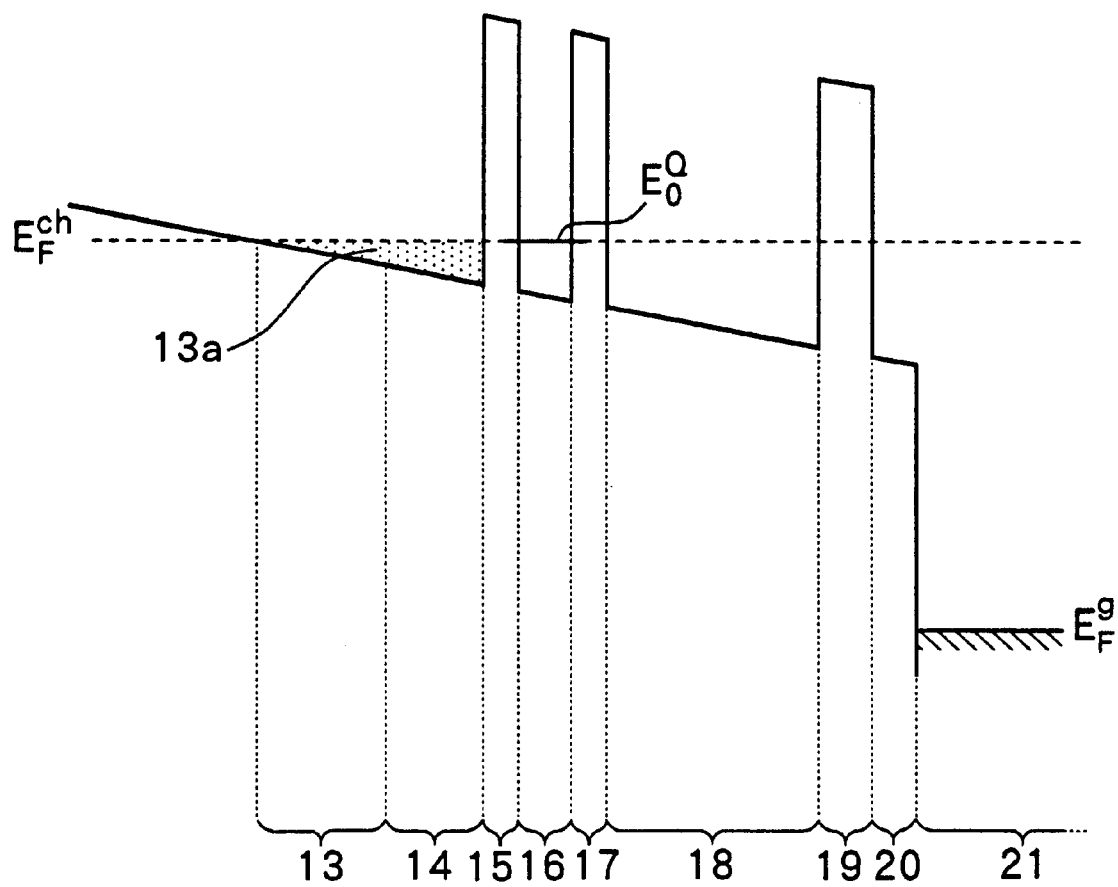
FIG. 5 is a structural diagram of an energy band in the direction along the I—I line of FIG. 1, explaining the resonant-tunneling effect of the electric field effect transistor device shown in FIG. 1.

Furthermore, when the lowest energy level $E_0^Q$ of the two-dimensional electron states localized in the well layer 16 is identical to the fermi energy $E_F^{ch}$ in the conduction region 13a, few channel electrons which tunnel resonantly exist as shown in FIG. 5 (called minimum resonance). When the lowest energy level $E_0^Q$ of the two-dimensional electron states localized in the well layer 16 is higher than the fermi energy $E_F^{ch}$ in the conduction region 13a, no resonance occurs (non-resonance).

Figure 6:
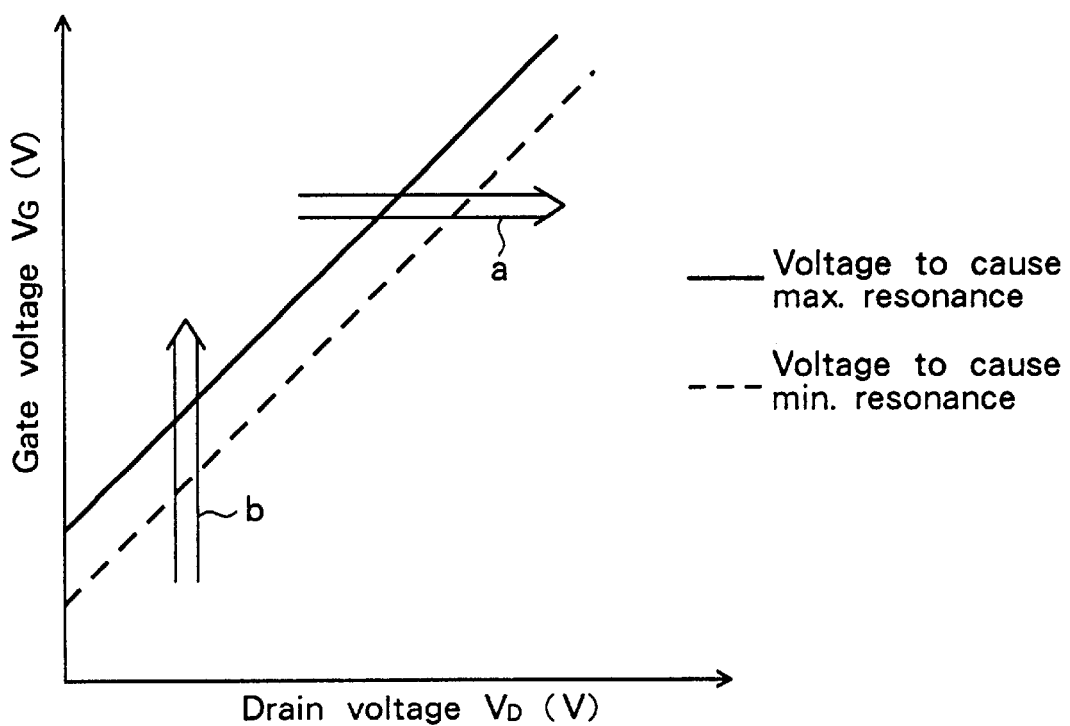
FIG. 6 is a characteristic diagram showing the range where the resonant-tunneling effect occurs when a drain voltage $V_D$ and a gate voltage $V_G$ are changed in the electric field effect transistor device shown in FIG. 1.

FIG. 6 shows the range in which the resonant-tunneling effect occurs when the source electrode 22 is grounded and the drain voltage $V_D$ and the gate voltage $V_G$ are changed. In FIG. 6, the solid line indicates voltages which cause the maximum resonance, whereas the broken line indicates voltages which cause the minimum resonance. The area between the solid line and the broken line denotes a resonance state. The region on the left side of the solid line serving as a boundary and the region on the right side of the broken line serving as a boundary denote a non-resonance state.

Figure 7:
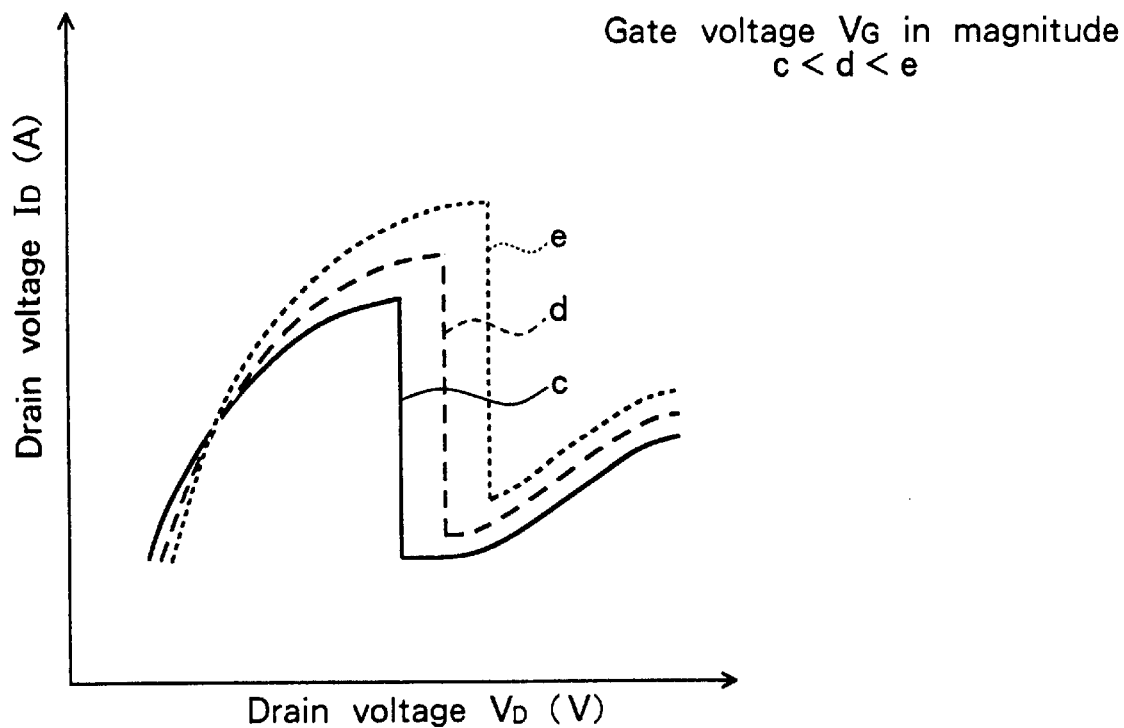
FIG. 7 is a characteristic diagram showing the relation between the drain voltage $V_D$ and a drain current $I_D$ in order to explain negative differential conductance in the electric field effect transistor device shown in FIG. 1.

Accordingly, as the drain voltage $V_D$ is applied while fixing the gate voltage $V_G$, maximum resonance occurs suddenly after non-resonance as indicated by the arrow a in FIG. 6. Therefore, the electric conductivity in the conduction region 13a disposed between the source electrode and the drain electrode greatly decreases; the large decrease of the drain current $I_D$ is observed. That is, negative differential conductance is observed. At this time the absolute value of the source current shows a large decrease. Thereafter, as the number of the channel electrons related to the resonance decreases, the drain current $I_D$ increases. As a result, the drain voltage $V_D$ and the drain current $I_D$ assume characteristics shown in FIG. 7. The value of the drain voltage showing the negative differential conductance varies in relation to the gate voltage $V_G$. For example, the value of the drain voltage increases as the gate voltage $V_G$ increases.

Figure 8:
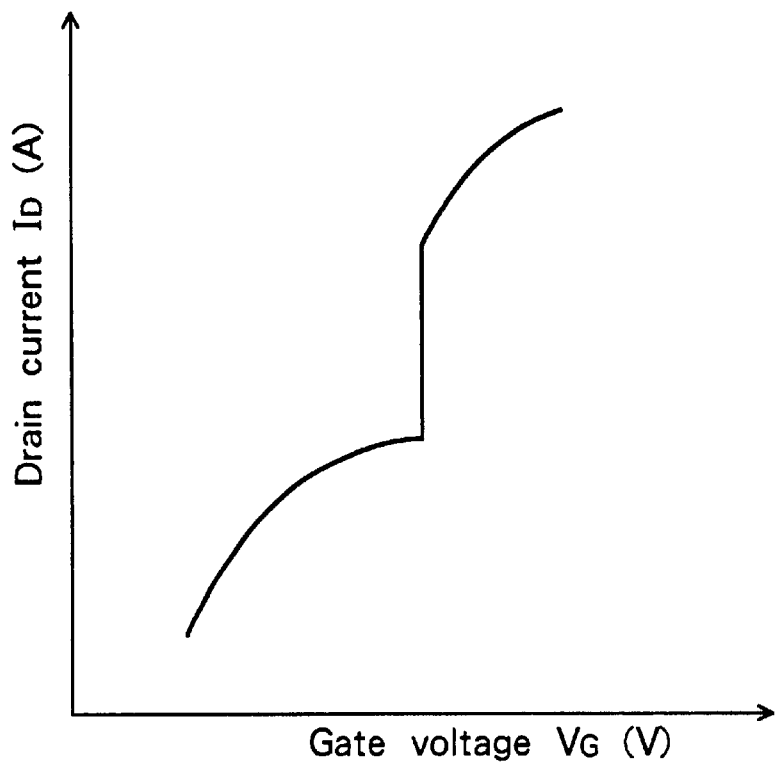
FIG. 8 is a characteristic diagram showing the relation between the gate voltage $V_G$ and the drain current $I_D$ in order to explain transconductance in the electric field effect transistor device shown in FIG. 1.
Figure 9:
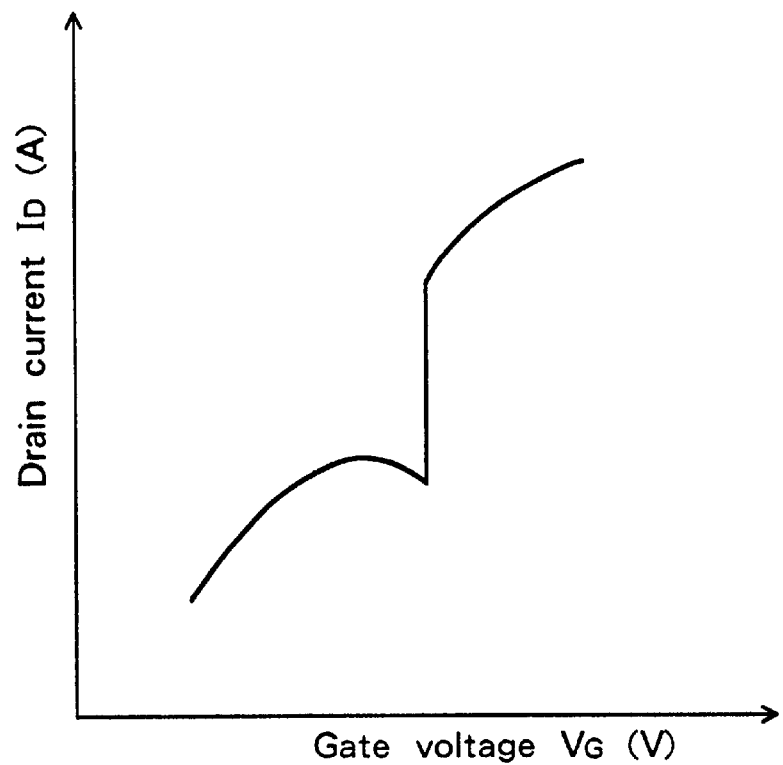
FIG. 9 is a characteristic diagram showing the relation between the gate voltage $V_G$ and the drain current $I_D$ in order to explain negative transconductance in the electric field effect transistor device shown in FIG. 1.

On the other hand, as the gate voltage $V_G$ is applied while fixing the drain voltage $V_D$, the following occurs as indicated by the arrow b in FIG. 6. First minimum resonance occurs; the number of the channel electrons in the resonance gradually increases and eventually reaches maximum resonance; and suddenly non-resonance occurs. Accordingly, the electric conductivity in the conduction region 13a disposed between the source electrode and the drain electrode dramatically increases and a large increase of the drain current $I_D$ is observed. At this time, the absolute value of the source current shows a large increase. Incidentally, between the minimum resonance and the maximum resonance, negative transconductance can be observed. However, this is determined by the balance between the transconductance which the device originally has and the rate of increase of the number of the channel electrons causing the resonance. The phenomenon described above occurs when the rate of increase of the number of the channel electrons causing the resonance is great. As a result, the gate voltage $V_G$ and the drain current $I_D$ assume the characteristic shown in either FIG. 8 or 9.

As described above with the electric field effect transistor device 10 according to the embodiment, the number of electrons in the floating region 18, which cannot contribute electric conductivity in the conduction region 13a, is controlled by the resonant-tunneling effect through the two-dimensional electron state in the well layer 16, thereby obtaining large negative differential conductance characteristics or negative transconductance characteristics.

Next, a method of manufacturing the electric field effect transistor device 10 according to the embodiment will be described with reference to FIGS. 10A and 10B.

Figure 10A:
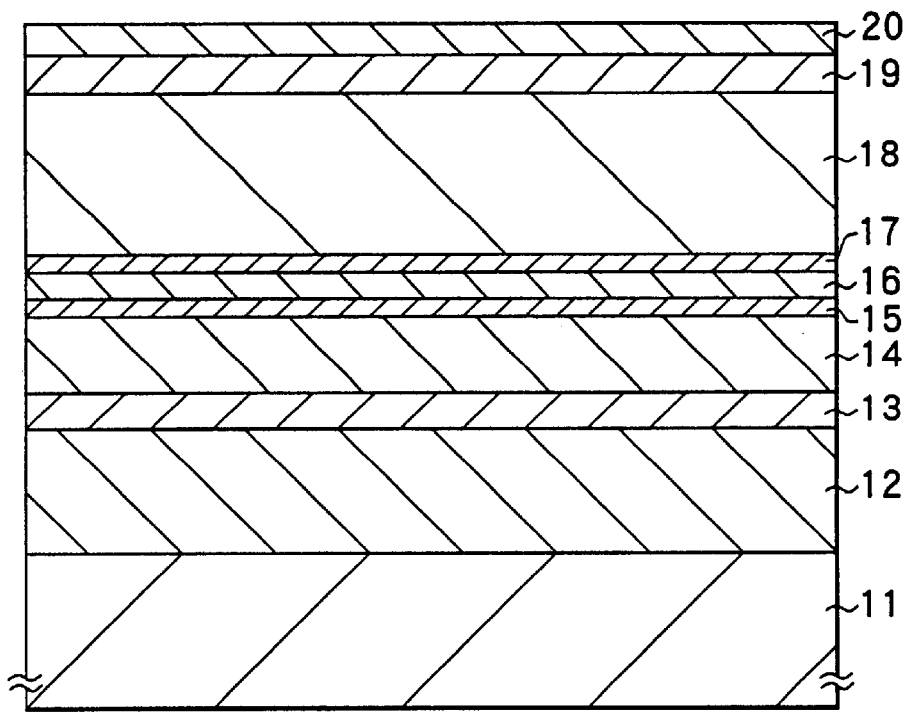
FIGS. 10A and 10B are cross sections explaining a manufacturing process of the electric field effect transistor device shown in FIG. 1.

First, as shown in FIG. 10A, a buffer layer 12, for example, made of GaAs with a thickness of 400 nm, a channel layer 13, for example, made of n-type doped GaAs with a thickness of 20 nm, a spacer layer 14, for example, made of GaAs with a thickness of 120 nm, a barrier layer 15, for example, made of AlAs with a thickness of 2 nm, a well layer 16, for example, made of GaAs with a thickness of 6 nm, a barrier layer 17, for example, made of AlAs with a thickness of 2 nm, a floating region 18, for example, made of GaAs with a thickness of 200 nm, a gate barrier layer 19, for example, made of AlAs with a thickness of 30 nm, a cap layer 20, for example, made of GaAs with a thickness of 10 nm are sequentially layered on, for example, a semi-insulating GaAs (001) substrate 11 by the molecular beam epitaxy (MBE) method, for example. Among aforementioned layers and region, the channel layer 13 and the spacer layer 14 function as a conduction region 13a as described above. Thus, the conduction region 13a is formed.

In stead of the MBE method, a metal organic chemical vapor deposition (MOCVD) method or a metal organic molecular beam epitaxy (MOMBE) method may be used for each of the buffer layer 12 through the cap layer 20 to be grown, for example.

Subsequently, device isolation is achieved by etching at least up to the channel layer 13 by, for example, an optical lithography method or electron beam lithography method. As an etching agent, a solvent in which phosphoric acid ($H_3PO_4$), hydrochloric acid (HCl), sulfuric acid ($H_2SO_4$), ammonium hydroxide ($NH_4OH$), potassium hydroxide (KOH) or the like is mixed with hydrogen peroxide ($H_2O_2$) or water ($H_2O$) is used. Alternatively, device isolation may be performed by ion implantation.

Figure 10B:
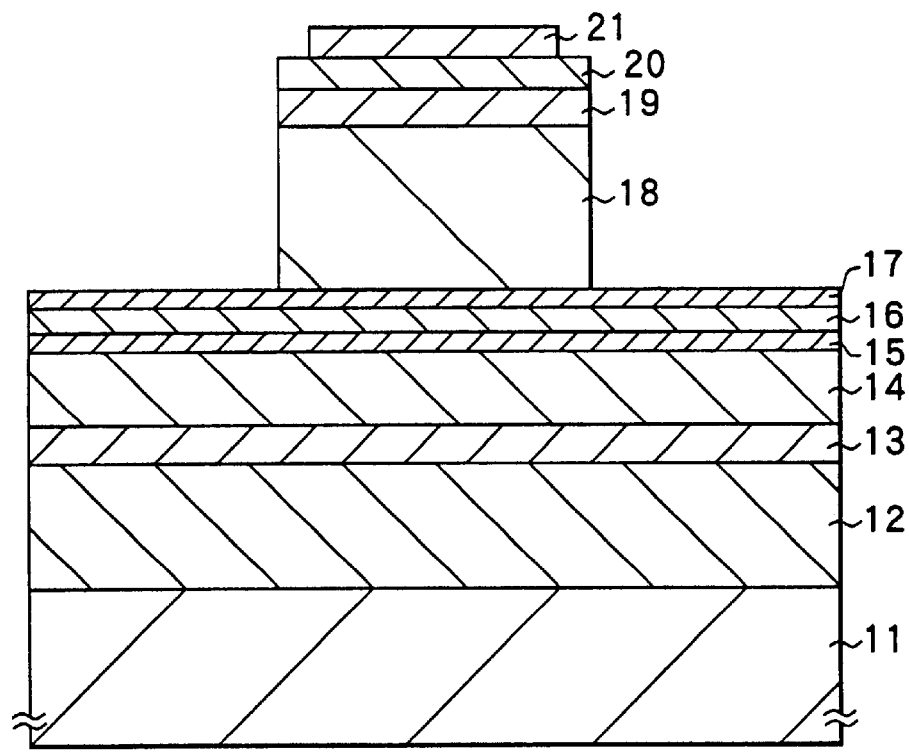

After isolation of the devices, as shown in FIG. 10B a gate electrode 21 made of an appropriate metal (for example, Al or Au) by, for example, optical lithography or electron beam lithography, and lift-off technique or metal etching technique. Thereafter, among the cap layer 20, gate barrier layer 19, and floating region 18, regions where a source electrode 22 and a drain electrode 23 will be formed are selectively removed in sequence. At that time, use of wet etching with an etching agent including citric acid, such as a mixed solution of citric acid and hydrogen peroxide enables the ratio of the speed of etching GaAs to the speed of etching AlAs to become very great. Consequently, the floating region 18 is easily selectively removed and the barrier layer 17 is oxidized but hardly etched. More specifically, the barrier layer 17 serves as an etching stop layer and the floating region 18 is selectively removed. Thus, the cap layer 20, the gate barrier layer 19 and the floating region 18 are shaped.

After shaping the floating region 18, the exposed regions of the barrier layer 17, that is the regions where the source electrode 22 and the drain electrode 23 will be formed are selectively removed by, for example, hydrochloric acid. Thus, a part of the well layer 16 is exposed. These steps take place in order to secure ohmic contact between the conduction region 13a and the source electrode 22, and between the conduction region 13a and the drain electrode 23 by removing the regions in the barrier layer 17 which have been oxidized. Thereafter, AuGe, Ni and Au are sequentially layered on the surface of the well layer 16 by, for example, an disposition method, and then heat treatment takes place thereon, thereby forming the source electrode 22 and the drain electrode 23. By this heat treatment a part of the well layer 16, the barrier layer 15, the spacer layer 14 and the channel layer 13 is alloyed, thereby forming the source region 24 and the drain region 25. Consequently, the electric field effect transistor device 10 illustrated in FIG. 1 is obtained. Also, in spite of using critic acid, selective etching using mixing chlorine-based and fluorine-based species can be employed in order to shape the floating region 18.

As described hereinbefore, in the electric field effect transistor device 10 of the embodiment having the floating region 18 which is electrically separated from the conduction region 13a and having the quantum well layer between the conduction region 13a and the floating region 18, the drain current characteristics show negative differential conductance when the drain voltage is changed relative to the gate voltage. Therefore, a three-terminal device having excellent negative differential conductance characteristics is easily obtained through a simple manufacturing process.

In some cases, a three-terminal device having the negative transconductance characteristics can be obtained.

Furthermore, according to the method of manufacturing an electric field effect transistor of the embodiment, the regions where the source electrode 22 and the drain electrode 23 will be formed are removed selectively by the etching agent including citric acid or mixing chlorine-based and fluorine-based species. Thereby, the floating region 18 which is electrically separated from the conduction region 13a is easily shaped.

In the above-described embodiment the barrier layers 15 and 17 and the gate barrier layer 19 are made of AlAs, respectively and the channel layer 13, the well layer 16 and the floating region 18 are made of GaAs, respectively. However, for instance, the barrier layers 15 and 17 and the gate barrier layer 19 may be made of $Al_aGa_{1-a}As$ ($0 \leq a \leq 1$), respectively and the channel layer 13, the well layer 16 and the floating region 18 may be made of $In_{1-b}Ga_bAs$ ($0 \leq b \leq 1$), respectively. In this case, the composition of the barrier layers 15 and 17 and the gate barrier layer 19 may be the same or may not be the same. The composition of the channel layer 13, the well layer 16 and the floating region 18 may be the same or may not be the same.

Moreover, each aforementioned layer can be made of different materials. For example, the barrier layers 15 and 17 and the gate barrier layer 19 may be made of $Al_cGa_{1-c}N$ ($0 \leq c \leq 1$), respectively, while the channel layer 13, the well layer 16 and the floating region 18 may be made of $In_{1-d}Ga_dN$ ($0 \leq d \leq 1$), respectively. The material or composition of the barrier layers 15 and 17 and the gate barrier layer 19 may be the same or may not be the same The composition of the channel layer 13, the well layer 16 and the floating region 18 may be the same or may not be the same. In this case, the substrate 11 is made of sapphire, silicon carbide (SiC) and the like, whereas the buffer layer 12 and the spacer layer 13 are made of GaN and the like, respectively.

The barrier layers 15 and 17 and the gate barrier layer 19 may be made of $SiO_2$, while the channel layer 13, the well layer 16 and the floating region 18 may be made of $Si_{1-e}Ge_e$ ($0 \leq e \leq 1$). The material or composition of the channel layer 13, the well layer 16 and the floating region 18 may be the same or may not be the same. In this case, the substrate 11 is made of Si or the like.

The barrier layers 15 and 17 and the gate barrier layer 19 may be made of SiGe or Si, and the channel layer 13, the well layer 16 and the floating region 18 may be made of Ge or SiGe. The composition of the barrier layers 15 and 17 and the gate barrier layer 19 may be the same or may not be the same. The material or the composition of the channel layer 13, the well layer 16 and the floating region 18 may be the same or may not be the same. In this case, the substrate 11 is made of Si or the like.

As described above when the barrier layers 15 and 17 are made of $AlcGa_{1-c}N$ ($0 \leq c \leq 1$) and the well layer 16 is made of $In_{1-d}Ga_dN$ ($0 \leq d \leq 1$) or the barrier layers 15 and 17 are made of $SiO_2$ and the well layer 16 is made of $Si_{1-e}Ge_e$ ($0 \leq e \leq 1.0$), the band discontinuity becomes large, thereby suppressing electrons transferring through the barrier layers 15 and 17 thermally. Thus, the resonant-tunneling effect is secured. In addition, suppression of gate leakage current can be expected.

Furthermore, when the barrier layers 15 and 17 are made of $SiO_2$ and the well layer 16 is made of $Si_{1-e}Ge_e$ ($0 \leq e \leq 1.0$), or the barrier layers 15 and 17 are made of SiGe and the well layer 16 is made of SiGe, the electric field effect transistor device of the embodiment can be used with the current integrated circuit made of Si.

[Second Embodiment]

Figure 11:
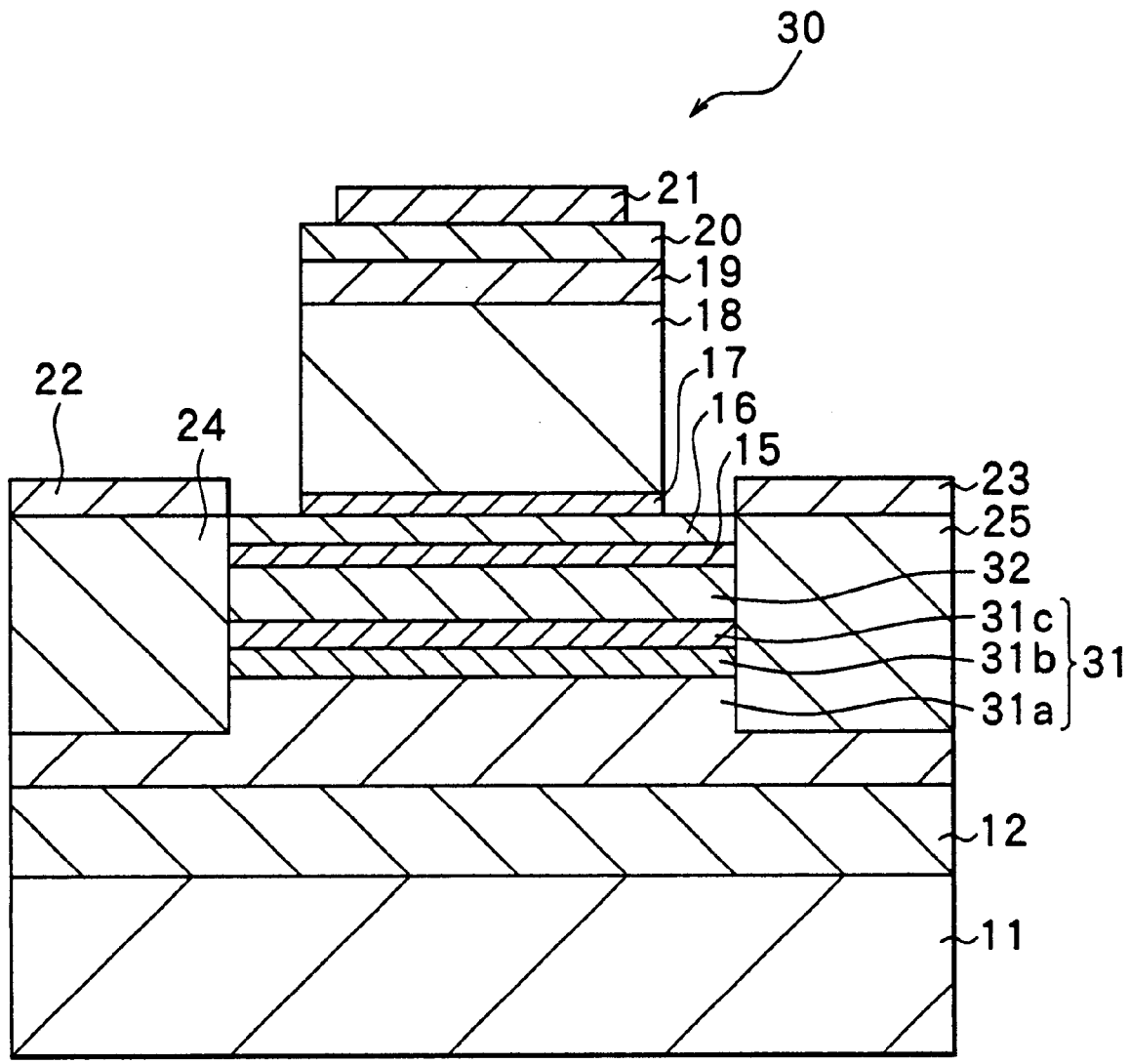
FIG. 11 is a cross section showing the structure of an electric field effect transistor device according to a second embodiment of the present invention.

FIG. 11 shows the sectional structure of an electric field effect transistor device 30 according to a second embodiment of the present invention. The electric field effect transistor device 30 has the same structure and effects as the first embodiment except that in stead of the channel layer 13 and the spacer layer 14 of the first embodiment, a channel barrier layer 31 and the channel layer 32 are provided on the buffer layer 12 in this order. The electric field effect transistor device 30 can be manufactured in the similar process to that of the first embodiment. Therefore, the same elements as those in the first embodiment are indicated by the same reference numerals and the detailed description is omitted here.

In the channel barrier layer 31, a high resistance layer 31a made of, for example, AlGaAs in which no impurities are doped, a carrier supply layer 31b made of, for example, AlGaAs whose impurity concentration is $1 \times 10^{18}$ $cm^{31\ 3}$ or over, and a spacer layer 31c made of, for example, AlGaAs in which no impurity doping takes place are stacked on the buffer layer 12 in sequence. The channel layer 32 is made of, for example, GaAs in which no impurities are doped. More specifically, the electric field effect transistor device 30 has a so-called inverted high electron mobility transistor (HEMT) structure. Electrons are accumulated in at least a part of the channel layer 32 and the channel layer 32 functions as a conductive region. That is, carriers in the conduction region are formed by means of modulation doping, thereby making carrier mobility high.

As described above according to the embodiment, the carriers in the conduction region are modulation doped. Therefore, it is possible to make the carrier mobility in the conduction region high. Besides, similar to the first embodiment materials composing each layer can be changed in this embodiment.

Although the present invention has been described above by exemplifying the embodiments, the present invention is not limited to the embodiments and various modifications are possible. For example, although electrons are used as carriers in the above embodiments, holes may be used in the invention. In this case the action of the semiconductor device is almost the same as that in the case where the electrons are used as carriers in the above-described embodiments except that the electrons are replaced by the holes.

Moreover, in the above embodiment, although described is a case where the barrier layer 17 close to the floating region 18 of a pair of the barrier layers 15 and 17 comprising the quantum well layer is used as the etching stop layer, the other barrier layer 15 may be used as the etching stop layer or both of the barrier layers 15 and 17 may be used as the etching stop layer. More specifically, as long as at least one of the barrier layers 15 and 17 is used as the etching stop layer, a similar effect is obtained. In this case, as described in the above embodiment, the exposed region in the barrier layer used as the etching stop layer, that is the region where the source electrode 22 and the drain electrode 23 will be formed is preferably selectively removed. This is for the following reason: If the floating region 18 is etched using an etching agent including citric acid, the region is oxidized at the time of etching the floating region 18. Therefore, if the region where each of the source electrode 22 and the drain electrode 23 will be formed is not selectively removed, it is difficult to secure ohmic contact between the conduction region 13a, and the source electrode 22 and the drain electrode 23.

Furthermore, in the above embodiments the width in the horizontal direction of the cap layer 20, the gate barrier layer 19, the floating region 18 and the barrier layer 17 is narrower than that of the well layer 16, and each of the source electrode 22 and the drain electrode 23 is formed on the surface of the well layer 16. However, at least making the width in the horizontal direction of the floating region 18 narrower than that of the channel layer 13 or 32, and forming each of the source electrode 22 and the drain electrode 23 so as to sandwich the floating region 18 therebetween enable the channel layer 13 or 32 to be electrically separated from the floating region 18. Consequently, the width in the horizontal direction of each layer disposed between the floating region 18, and the channel layer 13 or 32 may be narrower than that of the channel layer 13 or 32 or may not be narrower than that of the channel layer 13 or 32.

In the above embodiments although described is a case where one quantum well layer is provided between the conduction region 13a and the floating region 18, a plurality of quantum well layers may be provided.

Although in the second embodiment the conduction region is modulation doped by taking a so-called inverted HEMT structure, a so-called HEMT structure or other structures may be employed in stead of the inverted HEMT structure.

The above embodiments have been described by exemplifying the electric field effect transistor device as a semiconductor device. However, the present invention is broadly applied to other semiconductor devices which have a conduction region, a floating region which is electrically separated from the conduction region, a quantum well layer provided between the conduction region and the floating region, a source electrode and a drain electrode electrically connected to the conduction region, and a gate electrode provided in the opposite position from the quantum well layer in the floating region.

As described above according to the semiconductor device of the invention, the floating region which is electrically separated from the conduction region is provided, and the quantum well layer is provided between the conduction region and the floating region. Further, the source electrode and the drain electrode are electrically connected to the conduction region, and the gate electrode is provided in the opposite position from the quantum well layer in the floating region. Therefore, when the drain voltage is changed relative to the predetermined gate voltage, the drain current characteristics show negative differential conductance. As a consequence, manufactured is a three-terminal device showing excellent negative differential conductance without requiring a complicated manufacturing process.

Moreover, according to the semiconductor device of one aspect of the invention, the negative transconductance may be observed, so that the three-terminal device showing the negative transconductance is easily obtained.

Furthermore, according to the semiconductor device of another aspect of the invention, the carriers in the conduction region are modulation doped, so that carrier mobility becomes high.

Further, according to the method of manufacturing a semiconductor device of the invention, after forming the floating region, the region where each of the source electrode and the drain electrode will be formed is selectively removed by an etching agent including citric acid or mixing chlorine-based and fluorine-based species. Therefore, the floating region electrically separated from the conduction region is easily shaped.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device including a conduction region, a floating region which is electrically separated from the conduction region, a quantum well layer which is provided between the conduction region and the floating region, a source electrode and a drain electrode each of which is electrically connected to the conduction region, and a gate electrode which is provided in an opposite position from the quantum well layer in the floating region, the method comprising the steps of:

first step for forming the conduction region, the quantum well layer and the floating region on a substrate in this order; and second step for shaping the floating region by selectively removing a region, in which the source electrode and the drain electrode will be formed, by an etching agent including citric acid or mixing chlorine-based and fluorine-based species.

2. The method of manufacturing a semiconductor device according to claim 1, wherein the quantum well layer includes a well layer and a pair of barrier layers which is provided so as to sandwich the well layer, and at least one of the pair of barrier layers serves as an etching stop layer in the second step.

3. The method of manufacturing a semiconductor device according to claim 2, further comprising a third step for selectively removing the barrier layer used in the second step as the etching stop layer after the second step.

* * * * *